United States Patent
Abel et al.

(10) Patent No.: US 9,135,201 B2
(45) Date of Patent: Sep. 15, 2015

(54) SWITCHING DEVICE FOR ROUTING DATA, COMPUTER INTERCONNECTION NETWORK AND ROUTING METHOD USING SUCH DEVICE

(75) Inventors: Francois Abel, Rueschlikon (CH); Mitch Gusat, Rueschlikon (CH); Cyriel Minkenberg, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 335 days.

(21) Appl. No.: 13/700,534

(22) PCT Filed: May 25, 2011

(86) PCT No.: PCT/IB2011/052267
§ 371 (c)(1),
(2), (4) Date: Feb. 12, 2013

(87) PCT Pub. No.: WO2011/148320
PCT Pub. Date: Dec. 1, 2011

(65) Prior Publication Data
US 2013/0311697 A1 Nov. 21, 2013

(30) Foreign Application Priority Data
May 28, 2010 (EP) .................... 10164400

(51) Int. Cl.
*H04L 12/933* (2013.01)
*G06F 13/40* (2006.01)
(Continued)

(52) U.S. Cl.
CPC ...... *G06F 13/4027* (2013.01); *G06F 15/17375* (2013.01); *G06F 17/509* (2013.01); *H04L 49/101* (2013.01)

(58) Field of Classification Search
None
See application file for complete search history.

(56) References Cited

U.S. PATENT DOCUMENTS

| 6,449,283 B1 | 9/2002 | Chao et al. |
| 2002/0034183 A1 | 3/2002 | Prabhakar et al. |
| 2006/0101234 A1* | 5/2006 | Hannum et al. ................. 712/11 |

FOREIGN PATENT DOCUMENTS

CN 101325794 12/2008

OTHER PUBLICATIONS

Oruc et al., Crosspoint Complexity of Sparse Crossbar Concentrators, IEEE Transactions on Information Theory, vol. 42, No. 5, Sep. 1996, p. 1466-1471.*

(Continued)

*Primary Examiner* — Hoon J Chung
(74) *Attorney, Agent, or Firm* — Fleit Gibbons Gutman Bongini & Bianco PL; Jon A. Gibbons

(57) ABSTRACT

The invention is directed to a switching device ($S_{ij}$) adapted to connects parts of a computer interconnection network, having N input ports ($I_a$-$I_h$) and N output ports ($O_a$-$O_h$), the device adapted for routing data packets by means of direct crosspoints ($CP_{xy}$), the direct crosspoints configured for enabling direct connectivity between each of the N input ports to a subset m<N of the output ports only, in accordance with connectivity needs of the computer interconnection network. Preferably, it further comprises an additional circuitry (L) and additional crosspoints ($AP_{x,L}$, $AP_{L,y}$) configured such that at least some of the input ports of the switching device can be indirectly connected to at least some of the output ports of the switching device, through the additional circuitry. The invention further concerns an interconnection network and a method for routing data.

14 Claims, 4 Drawing Sheets

(51) Int. Cl.
G06F 15/173 (2006.01)
G06F 17/50 (2006.01)

(56) References Cited

OTHER PUBLICATIONS

International Search Report and Written Opinion dated Sep. 21, 2011 for PCT/IB2011/052267.
Scherson, I.D., et al., "Least Common Ancestor Networks," Parallel Processing Symposium, 1993, Proceedings of Seventh International, Newport, CA, USA Apr. 13-16, 1993, Los Alamitos, CA, USA, IEEE Comput. Soc., US Apr. 13, 1993, pp. 507-513, XP010031902, DOI: 10.1109/IPPS.1993.262825, ISBN: 978-0-8186-3442-0.
Nakamura, S., et al., "Lower Bounds on Crosspoints in Concentrators," IEEE Transactions on Computers, IEEE Service Center, Los Alamitos, CA, US., vol. C-31, No. 12, Dec. 1, 1982, pp. 1173-1179, XP00820685, ISSN: 0018-9340.
Pan, D., et al.,"Providing Flow Based Performance Guarantees for Buffered Crossbar Switches," IEEE Parallel and Distributed Processing Symposium, Apr. 2008, pp. 1-12. Print ISBN:978-1-4244-1693-6, DOI:10.1109/IPDPS.2008.4536318.
Koren, I., et al., "Fault Tolerant Systems, Chapter 4: Network Fault Tolerance," Apr. 13, 2007, pp. 1-12, Print Book ISBN : 9780120885251.
Masson, G., et al., "A Sampler of Circuit Switching Networks," IEEE Computer Society Press, Jun. 1979, pp. 32-48, vol. 12 Issue 6. doi 10.1109/MC.1979.1658777.
Chinese Website, visited on Oct. 20, 2014. http://wenku.baidu.com/link?url=y4JXNcLI8uOLTzNQ_LSXqHnEnXbyB6QnbYRTsrHQW9mirF7pz35bscQNKRTQnuquG3UFUkRWRyx_PgTDO3Xi1TMMnFv22oBYdBmyGT-AWPW.

* cited by examiner

SWITCHING DEVICE FOR ROUTING DATA, COMPUTER INTERCONNECTION NETWORK AND ROUTING METHOD USING SUCH DEVICE

CROSS-REFERENCE TO RELATED APPLICATIONS

This application is based upon and claims priority from prior Patent Cooperation Treaty Application No. PCT/IB2011/052267 filed on May 25, 2011, which is based on and claims priority from European Patent Application No. 10164400.3, filed on May 28, 2010, the entire disclosures of which are hereby incorporated by reference herein.

FIELD OF THE INVENTION

The invention relates to the field of methods and systems for routing data in a computer interconnection network. In particular, it relates to a switching device having optimized circuitry for routing data packets from input ports to output ports thereof.

BACKGROUND OF THE INVENTION

One knows switching devices such as single-stage packet switching nodes. Such nodes have a given, inherent implementation complexity. Namely, in an N-port packet switch, there is an N-to-N connection problem that leads to quadratic complexity. Although there are many different switch architectures (e.g., input-queued, output-queued, combined input- and output-queued, shared memory, etc.), this complexity manifests itself in all of these architectures in some way.

This complexity essentially stems from the non-blocking requirement, which requires that any one-to-one communication pattern (permutation) can be routed without conflicts. The complexity can only be reduced by relaxing this requirement, i.e., by allowing conflicts to occur even between communications from/to different ports. This leads to blocking switch architectures, which are usually based on a shared medium such as a bus or on a multi-stage arrangement. A disadvantage of such approaches is the limited aggregate throughput achievable due to physical limitations of e.g. a bus-based implementation.

Most existing single-stage switching node implementations satisfy the non-blocking requirement, i.e., they provide the capability to send at full capacity from any input port to any output port. In the specific case of crossbar-based architectures (which may be buffered or unbuffered), this implies that the switching node comprises $N^2$ crosspoints. Moreover, in the case of buffered crossbar architectures, each crosspoint comprises a buffer that is sized to allow full link utilization over a full round-trip. In many cases, it can be realized that much of this buffering capacity will go largely unused, which represents a waste of precious resources.

BRIEF SUMMARY OF THE INVENTION

According to a first aspect, the present invention is embodied as a switching device adapted to connect parts of a computer interconnection network, having N input ports and M output ports, wherein M is preferably equal to N, the device adapted for routing data packets by means of direct crosspoints, the direct crosspoints configured for enabling direct connectivity between each of the N input ports to a subset m<M of the output ports only, in accordance with connectivity needs of the computer interconnection network.

In embodiments, the said device may comprise one or more of the following features:
The switching device comprises a number of direct crosspoints less than or equal to N M−$N_1$, $N_1 \leq$ Min[N, M], whereby the device prevents direct connectivity between at least a subset of the $N_1$ input ports and $N_1$ output ports corresponding to the same ports.
The switching device comprises:
 $N_1$ input ports, $N_1$<N, adapted to receive data from one or more first network entities; and
 $N_2$ output ports, $N_2$<M, adapted to send data to one or more second network entities; wherein the number of direct crosspoints is less than or equal to N M−$N_1$ $N_2$.
M=N and the number of direct crosspoints is equal to $N^2 - N_1 N_2 - (N - Min(N_1, N_2))$, with preferably $N_1 = N_2 = N/2$.
the switching device further comprises an additional circuitry and additional crosspoints configured such that at least some of the input ports of the switching device can be indirectly connected to at least some of the output ports of the switching device, through the additional circuitry.
the additional crosspoints comprise:
 at least one first set of crosspoints, each connecting an input port of the device already connected to one or more direct crosspoints to the circuitry; and
 at least one second set of crosspoints, each connecting the circuitry to an output port of the device already connected to one or more direct crosspoints.

According to a second aspect, the present invention is further embodied as a computer interconnection network, comprising at least one switching device according to embodiments of the invention.

In embodiments, the said network may comprise one or more of the following features:
the computer interconnection network comprises at least one switching device according to embodiments of the invention and further comprises the one or more first network entities and the one or more second network entities;
the computer interconnection network comprises at least one switching device according to an embodiment of the invention, wherein:
 the one or more first network entities are each a lower switching device in the computer interconnection network;
 the one or more second network entities are each an upper switching device in the computer interconnection network;
 and wherein M=N and $N_1 = N_2 = N/2$, such that the at least one switching device comprises $3N^2/4 - N/2$ direct crosspoints, such as to prevent direct connectivity between:
 an input port and an output port corresponding to a same port of said device; and
 the N/2 input ports adapted to receive data from an upper switching device and the N/2 output ports adapted to send data to an upper switching device;
the computer interconnection network further comprises a computerized routing method for the computer interconnection network, preferably based on the up*/down* routing algorithm, and the computer interconnection network is further configured such that the direct crosspoints of the at least one switching device can directly connect the input ports to a subset of the output ports only, in accordance with connectivity needs determined by the computerized routing method.

In yet another aspect, the present invention is embodied as a computer-implemented method for routing data, comprising: providing the computer interconnection network according to embodiments of the invention; and routing data via crosspoints of the at least one switching device of the computer interconnection network.

In embodiments, the said method may comprise one or more of the following features:
- the computer interconnection network provided comprises at least one switching device according to an embodiment of the invention and the step of routing data comprises: upon receiving a data packet for a pair of input port and output port not connected by a direct crosspoint, routing said data packet via some of the additional crosspoints and circuitry of the device;
- the computer interconnection network provided comprises at least one switching device according to an embodiment of the invention and the step of routing data comprises: upon receiving a data packet for a pair of input port and output port not connected by a direct crosspoint, routing said data packet by: directing said packet to a crosspoint of the at least one first set, connected to the input port from which the data packet is received; via the circuitry, looping said packet back to a crosspoint of the second set, connected to an output port to which the data packet is destined;
- the method further comprises, before the step of providing, a step of determining the said connectivity needs by means of known or expected intensity of data packet arrivals at said input and output ports, and the step of providing comprises providing the computer interconnection network, comprising at least one switching device, whose direct crosspoints are configured for enabling direct connectivity between each of the N input ports to a subset m<M of the output ports only, in accordance with the determined connectivity needs of the computer interconnection network.

According to a final aspect, the present invention is further embodied as a computer program product for routing data, said computer program product comprising: a computer readable storage medium; and program instructions to route data via crosspoints of at least one switching device of a computer interconnection network according to embodiments of the invention, wherein said program instructions are stored on said computer readable storage medium.

A switching device, a computer interconnection network and a touting method embodying the present invention will now be described, by way of non-limiting examples, and in reference to the accompanying drawings.

DETAILED DESCRIPTION OF THE INVENTION

Figure 1:
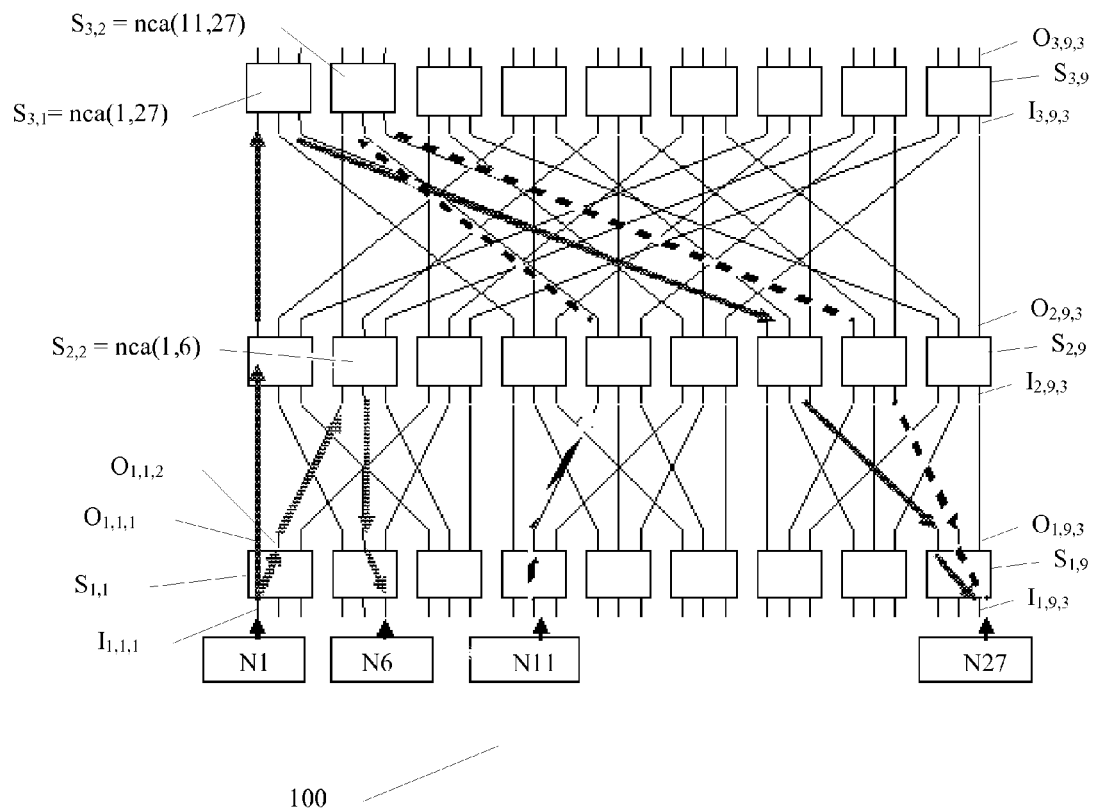
FIG. 1 schematically depicts a computer interconnection network.

The present invention proposes switching devices that reduce redundancy based on a sparsely populated crossbar structure. In other words, the crosspoints are configured for enabling direct connectivity between N input ports of the switch to a subset m<M of the output ports only. Each of said crosspoints can thus be regarded as a direct crosspoint, inasmuch as it allows for a direct port-to-port connectivity. For the sake of simplicity, use is made of M=N (a square switch is assumed). However, many of the concepts discussed below can be straightforwardly extended to non-square switches.

As to be discussed in details later, embodiments provide additional crosspoints beyond the direct crosspoint, which are arranged such as to avoid sacrificing reachability. Yet, a reduced number of crosspoints can still be achieved.

We take here advantage of the fact that, generally, a switch is not meant to be used in isolation but instead as part of a larger system that comprises many such switches, connected to form a certain topology, and with a given routing method being used to route data packets according to that topology. In addition, the traffic patterns (spatial distribution) occurring in a given system may give rise to certain connections being much lighter loaded than others.

Taking these factors into account, we can reduce the switch complexity by optimizing the internal resources according to the usage patterns that result from routing scheme and/or traffic characteristics, be it prefixed or not. In other words, the presence of absence of direct crosspoints depends on connectivity needs of the computer interconnection network.

A key advantage of the invention is a reduction in the number of crosspoints needed to implement a switching node of a given dimension N. A sparsely populated structure basically reduces the complexity of the device. Note that the switch can be buffered or not. In the former case, the use of the buffering capacity can be optimized.

In this context, a crosspoint is to be understood as a generic means of (directly) connecting an input port with an output port. Taken individually, a crosspoint as used in embodiments of the present invention is for instance essentially comparable to one of the $N^2$ crosspoints as provided in known crossbar-based switch architectures. As the overall crosspoint count is a good indicator of overall switching node cost and complexity, reducing the number of crosspoints will generally lead to a commensurate cost reduction. As a specific example, in a buffered crossbar switch the crosspoints with their associated buffers and control logic account for the vast majority of the total complexity (in gates).

More in details now, computer interconnection networks such as interconnection networks in data centers or high-performance computing (HPC) systems are made up of individual packet switching nodes, inter-connected in a certain topology. Common topologies include indirect networks such as Clos networks, Benes networks, fat trees (k-ary n-trees), k-ary n-flies, and direct networks such as torus networks (k-ary n-cubes), meshes, hypercubes.

To determine a path from any source to any destination node on a given topology, a routing algorithm is needed. A path is uniquely determined by the sequence of links between switches that are taken to get from source to destination. Often, a routing algorithm has a particular structure or is subject to particular constraints. Examples of such constraints can be that only shortest-path routes may be taken (minimum number of hops), and that routes must be deadlock free (no cycles in the channel dependency graph).

FIG. 1 illustrates a fat tree multi-stage interconnection network 100. The fat tree shown in the figure is a 3-ary 3-tree (k=3 (radix), n=3 (number of levels)). This notably means that each switch has three ports down and three ports up, so that three nodes can be connected to the switches in the lowest level, and each switch is connected to three switches in the next level. In other words, the fat tree can support 27 end nodes, denoted by N1 to N27, in this example. All connections in the network are fully bidirectional. End nodes (e.g., computing nodes) attach to the ports $I_{1,1,1}$ to $I_{1,9,3}$ at the bottom of the network (also the bottom of the figure), whereas the ports going up ($O_{1,1,1}$ to $O_{1,9,3}$) connect to another level of switches to scale the system to support additional nodes. More generally, input port $I_{i,j,x}$ (x=1, 2, . . . ) denotes the $x^{th}$ input port of node $S_{i,j}$, where $S_{i,j}$ denotes the $j^{th}$ node in the $i^{th}$ layer. Similarly, output port $O_{i,j,x}$ denotes the $x^{th}$ output port of node $S_{i,j}$. Furthermore, for a given node $S_{i,j}$: the node $S_{i-1,j}$ is called a lower level switching device, while node $S_{i+1,j}$ is an upper level switching device (with respect to the computing nodes). Note that some of the computing nodes (N2-N5, N7-N10, and N12-N26) are not represented, for obvious clarity reasons. Other topologies could however be contemplated, involving other arrangements/numbers of switches and computing nodes.

On such a fat tree topology, the so called up*/down* routing appears to be a suitable algorithm. This routing algorithm works as follows: for a given source s and destination d:
1. Find a switching node (here denoted functionally by nca(s, d)) that is a nearest common ancestor of s and d; in case there are multiple candidates, one is selected according to a given rule;
2. Route upwards on the unique ascending path from s to nca(s, d);
3. Route downwards on the unique descending path from nca(s, d) to d;

This algorithm has the properties of being shortest path as well as free of deadlocks.

For instance, FIG. 1 illustrates one of nine possible paths from node N1 to node N27 and from node N11 to node N27, as well as one of three possible paths from node N1 to node N6. The switching node nca(1, 6), which corresponds to node $S_{2,2}$, is for instance one of the possible nearest common ancestor of the nodes N1 and N6. Similarly, the nodes nca(1, 27) and nca(11, 27) are identified in FIG. 1, which respectively correspond to nodes $S_{3,1}$ and $S_{3,2}$.

Upon closer inspection, it can be realized that the above routing algorithm results in a limitation of the turns that are allowed to be taken in a given switching node. In particular, whenever a packet enters a switch coming down, it may never be routed back up again.

Figure 2:
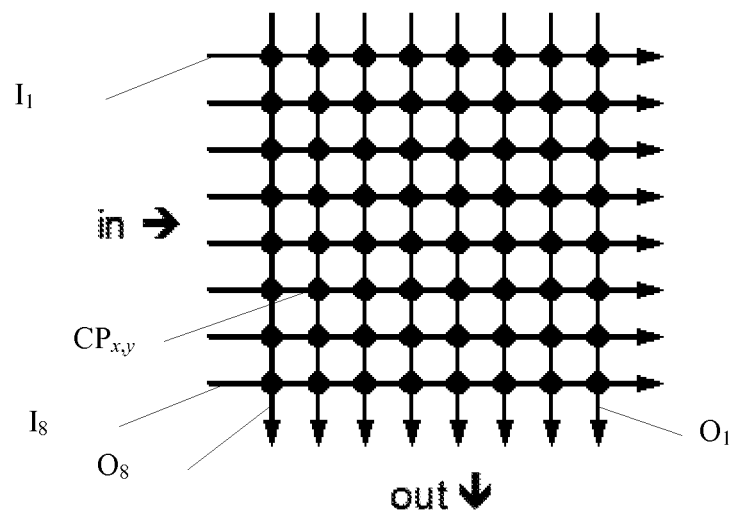
FIG. 2 schematically illustrates a switching device having a crossbar-based architecture, with $N^2$ crosspoints, as known from prior art.

However, prior art switching nodes are implemented in a way that allows connections between any combination of inputs and outputs, i.e., they offer full connectivity. Such a switching node can for instance be considered as a matrix of crosspoints that directly connect input lines to output lines. An example of a matrix of crosspoints is depicted in FIG. 2: the direct crosspoints $CP_{x,y}$ connects input ports $I_x$ to output ports $O_y$ (indices i,j are henceforth dropped for conciseness, i.e., input port $I_x$ denotes the $x^{th}$ input port of the represented node). Therefore, a switching node that offers full connectivity has $N^2$ crosspoints (or N.M crosspoints, for non-square nodes). Furthermore, the actual implementation complexity associated with each crosspoint depends on the specific switching node architecture (unbuffered crossbar, buffered crossbar, shared memory, etc.), as known.

Taking into consideration that a given computer interconnection network (such as the network 100 of FIG. 1) may have "forbidden" turns, as e.g. defined by the routing algorithm and topology, we can next contemplate to remove some of the crosspoints. Yet, beyond networks as depicted in FIG. 1 and the up*/down* routing algorithm, the skilled person shall appreciate that other networks/routing algorithm may also results in forbidden data routes. For example, some particular nodes may be prevented from routing data from given first network entities to given second network entities. In such cases, a sparse crosspoint structure can advantageously be implemented at the switches, as outlined above.

Figure 3:
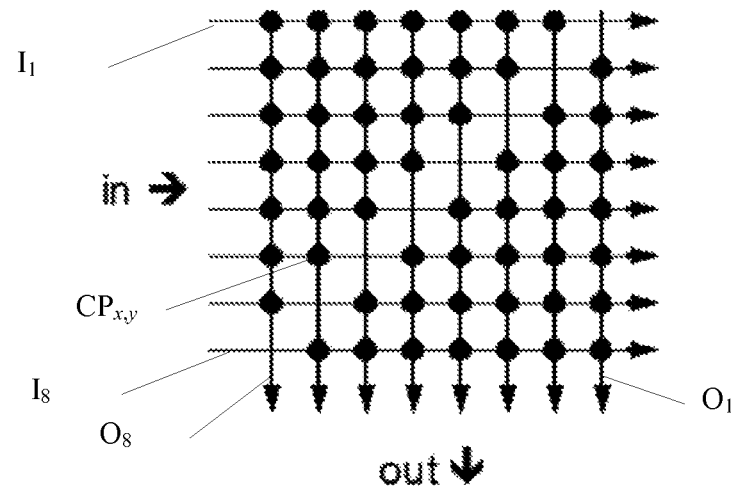
FIGS. 3-7 depict switching devices, represented as sparsely populated crossbar structures, according to embodiments of the invention. One or more such devices may for instance be arranged in a computer interconnection network as depicted in FIG. 1.
Figure 4:
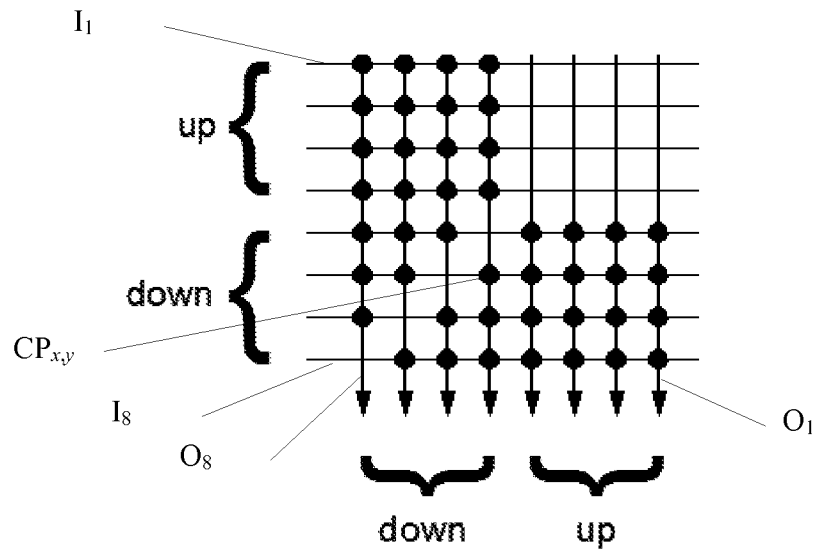
Figure 5:
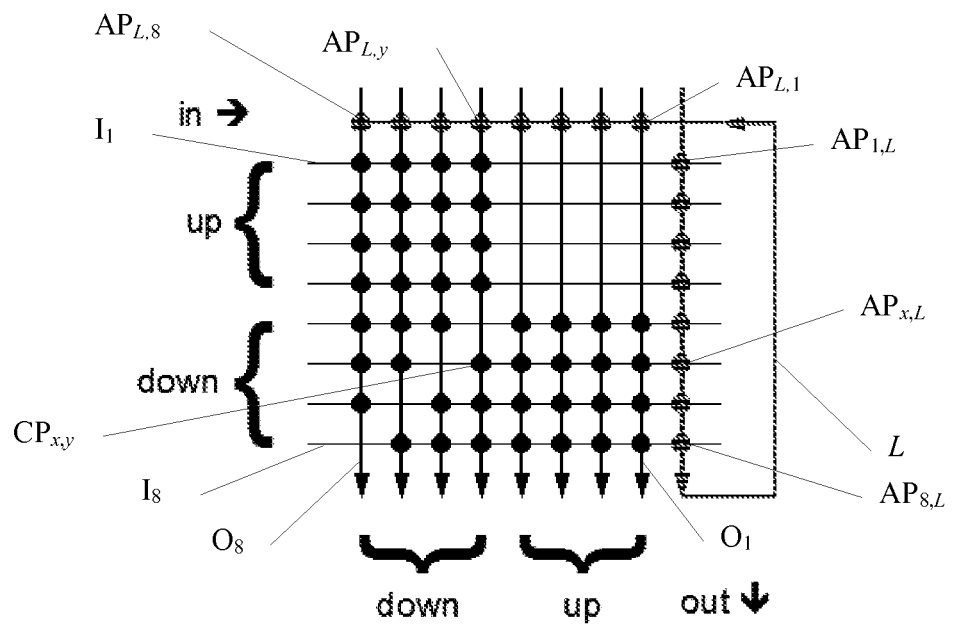
Figure 6:
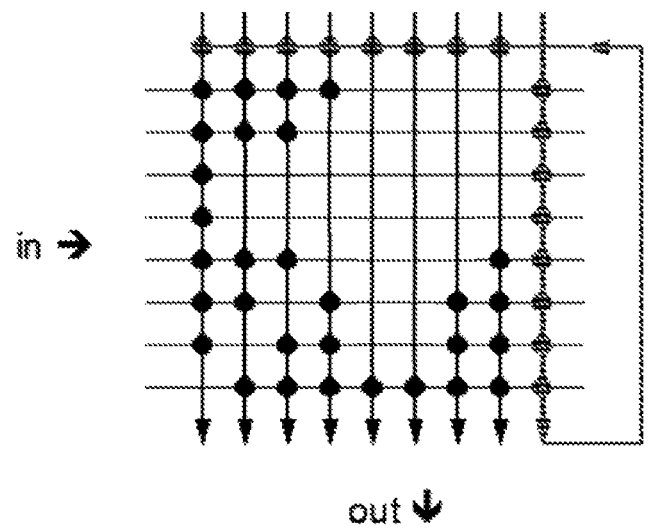
Figure 7:
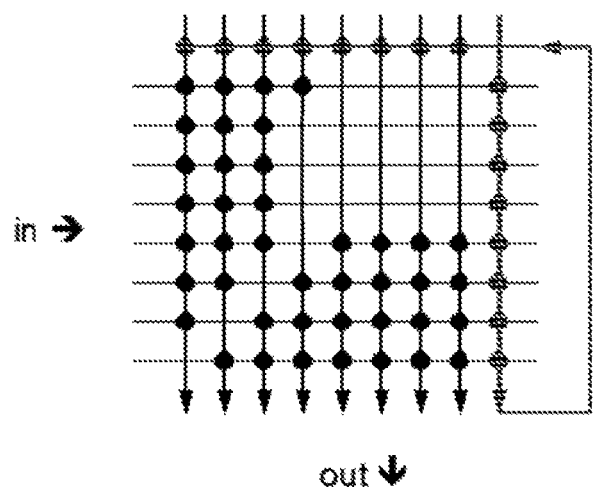

This is for instance illustrated in the crosspoint structures of FIGS. 3-5. Again, the underlying switching device has N input ports $I_x$ and M output ports $O_y$. It is designed to route ("in") data packets from each of the input ports to some of the output ports ("out"), via the (direct) crosspoints $CP_{x,y}$. In the examples of FIGS. 2-5, x=1, . . . 8, and y=1, . . . 8. Furthermore, embodiments of FIGS. 3-7 could be applied to any node $S_{i,j}$ of an interconnection network such as depicted in FIG. 1.

As represented in the embodiments of FIGS. 3-5, the crosspoints $CP_{x,y}$ retained enable direct connectivity between the input ports to a subset m<M of the output ports only. From now on and for simplicity, we assume a square switch (M=N). In the particular example of FIG. 3, the number of direct crosspoints is exactly equal to $N^2-N$, i.e., the direct crosspoints $CP_{x,y=x}$ have been removed (or rather, the switch is built without the crosspoints $CP_{x,y=x}$). Thus, the device prevents direct connectivity between input ports and output ports that correspond to a same port x, i.e. a same bidirectional port in that case. Indeed, if $N^2$ corresponds to the number of direct crosspoints required for full connectivity, N corresponds to the number of direct crosspoints required for direct connectivity between all pairs of input/output ports corresponding to a same port. Thus, the crosspoint structure illustrated in FIG. 3 has a reduced complexity.

More generally, the residual subset m<N of output ports can be designed in accordance with the connectivity needs of the network, resulting in different levels of node complexity.

For instance, the actual number of direct crosspoints may be less than $N^2-N_1$ ($N_1 \le N$), such as to prevent a direct connectivity between at least a subset of input ports (i.e., $N_1$ input ports) and a corresponding number of output ports (i.e., corresponding to a same bidirectional port).

In other situations, one may want to prevent direct connectivity between the $N_1$ input ports that receive data from a first subset of network entities and the $N_2$ output ports that send data to a second subset of entities. Thus, $N^2-N_1 N_2$ crosspoints would here be provided in this case. Comments are in order: each subset of network entities may possibly consist of only one node. Also, the two subsets may overlap and possibly correspond to the same entities.

In FIG. 4, $N_1 \times N_2$ crosspoints are notably discarded, preventing direct connectivity between first and second subsets of network entities. More precisely, in this example, one has $N_1=N_2=N/2$, owing to the network topology considered here, i.e., the $N_1$ incoming ports corresponding to the "up" side of the switch are not connected to the $N_2$ outgoing ports of the "up" side of the switch.

In addition, if the connectivity needs of the network are such that no port should ever have to route back to itself, as evoked earlier, then all crosspoints on the diagonal may further be omitted. Such a situation is illustrated in FIG. 4, whence the crosspoint pattern obtained.

The situation of FIG. 4 can be generalized to an embodiment where $N^2-N_1 N_2-(N-Min(N_1, N_2))$ crosspoints are provided, which amounts to prevent direct connectivity between $N_1$ input ports and $N_2$ output ports, while no port can route back to itself. In the particular case of $N_1=N_2=N/2$, the previous formula reduces to $3N^2/4-N/2$. Thus, such an embodiment allows to roughly omit one quarter of the direct crosspoints (for N large).

Next, as eliminating a crosspoint at the intersection between ports $I_x$ and $O_y$ implies that $I_x$ can no longer reach $O_y$, we may want to restore connectivity, e.g. indirectly. To this aim, the switching device of the invention may further comprise, in embodiments, additional crosspoints configured such that input ports can be indirectly connected to output ports of the switch, through an additional circuitry L of the device. Thus, when receiving a data packet for a pair of input and output ports which is not connected by a direct crosspoint, the data packet can still be routed via the additional crosspoints and circuitry L of the device, as depicted in FIG. 5.

Conceptually, it can be realized that such a problem amounts to connect additional rows and columns of the crosspoint matrix structure, such that several actual embodiments can be contemplated. Advantageously yet, and as shown in FIG. 5, a simple embodiment uses two sets of additional crosspoints $AP_{x,L}$ and $AP_{L,y}$, connected through the additional circuitry L. Each additional crosspoint $AP_{x,L}$ connects an input port $I_x$, already connected to direct crosspoints $CP_{x,y}$, to the circuitry L. Similarly, a second set of additional crosspoints $AP_{L,y}$ connects the circuitry to the output ports $O_y$ of the device.

More generally, we may add one or more fully populated columns and one or more fully populated rows to the switching matrix. These columns and rows do however not correspond to external ports; they are for internal use only. We refer to these additional rows and columns as "bypasses". Every bypass column is connected to one of the bypass rows (and vice versa), via the circuitry L, so that the latter creates internal loopback paths. The bypasses may be arranged such as to restore full reachability, independently of how many or which crosspoints have been eliminated. FIG. 5 shows an example for an 8×8 switching node with one bypass, i.e., the bypass column $AP_{x,L}$ is connected to the bypass row $AP_{L,y}$, via the circuitry L.

Concerning now the operation of data at the nodes: whenever a packet arrives for an unconnected pair of ports (e.g., $I_8$ and $O_8$), this packet is routed to the crosspoint on the extra column $AP_{8,L}$ that corresponds to its source port; from there, it is looped back to the extra row $AP_{L,8}$ to which the bypass is connected via the circuitry L, and is delivered to the crosspoint that corresponds to its destination port. Note that the bypass is shared by all port pairs that are not directly connected by a direct crosspoint. Packets from (directly) connected pair of ports are routed via the direct crosspoints, as usual.

In the example of FIG. 5, the sparse crossbar (including the bypass) has actually $3N^2/4-N/2+2$ N crosspoints (amongst which are 2 N additional crosspoints), versus $N^2$ for the fully connected crossbar. It can be shown that the sparse crossbar has lower complexity for any N>6. For example, for N=32, about 80% of crosspoints only needs to be retained. Increasing N allows for asymptotically approaching ~75% of the crosspoints, with respect to the full connectivity.

Next, in embodiments, the bypass may function as follows: when a packet arrives at a switch input, an input interface checks whether the packet is destined for a populated crosspoint. If yes, the packet is immediately routed to the destination crosspoint. Else, the packet cannot be routed directly to its destination column and must therefore be routed through a bypass. The input interface selects one out of available bypasses and routes the packet to the corresponding crosspoint $AP_{x,L}$. Preferably, each bypass column has its own scheduler. The bypass scheduler selects a packet from its column and routes it via its loopback to the corresponding bypass row $AP_{L,y}$ and to the particular crosspoint corresponding to the destination port of the packet. Every output scheduler schedules packets from bypass crosspoints as well as the regular crosspoints in its column. Many scheduling disciplines can be contemplated. In addition, as a remark, note that if none of the bypasses is available, a packet may have to be dropped (e.g., in the case of a buffered crossbar).

As said, bypasses are implemented mainly to allow full connectivity, i.e., every port can reach every other port. It can be realized that they may not be suitable for connections that have strict performance requirements. A bypass such as described above typically has two performance drawbacks: First, there is a latency penalty, because every packet that takes a bypass is stored and read twice before exiting the switch (in a buffered crossbar). Second, flows that use bypasses all share a limited set of crosspoints and have access to a limited internal bandwidth, which by design is (much) smaller than the possible maximum aggregate throughput of the attached ports. For example, in FIG. 5, the maximum aggregate throughput of all traffic flowing from the "up"-side inputs to "up"-side outputs is limited to the bandwidth of the single loopback path, so that in the worst case the throughput of the affected flows is only 25% (i.e., when every input sends at 100% load to an unpopulated crosspoint). This limitation can yet be improved by adding more bypasses.

As further evoked, the crosspoint elimination patterns need not be as regular as illustrated in FIG. 5; the sparseness can take any shape, symmetric (see e.g. the exemplary embodiment of FIG. 6) or not (FIG. 7), in accordance with connectivity needs of the computer interconnection network. Furthermore, the bypass rows and columns can sensibly vary from the depicted patterns. In particular, it is noted that that, strictly speaking, there is no need to add bypass crosspoints $AP_{x,L}/AP_{L,y}$ for row x or column y that is connected to all columns/rows, respectively. Also, where only one direct crosspoints is to be removed (owing to particular connectivity needs), it might actually be preferred to maintain it than to add the two crosspoints needed for the corresponding bypass. Corresponding variants to FIGS. 5-7 can thus be contemplated.

This approach can be generalized in a straightforward fashion to any topology and any routing scheme; given those, it is straightforward to determine for any switch which turns are never taken, and correspondingly eliminate crosspoints. Furthermore, the capacity of the bypass could be enhanced by adding multiple extra rows and columns (not represented). Note that, strictly speaking, if certain turns are never taken, a bypass for those turns is not even necessary. Implementing it nonetheless could however be useful for test/diagnosis purposes.

Moreover, the approach can also be generalized to take into account characteristics of the expected spatial traffic distribution. In some applications of packet switching, the traffic patterns observed at a switching node can be highly non-uniform, meaning that the traffic that flows in through a given input port is unequally distributed over the set of output ports, and/or the traffic that flows in through different input ports exhibits different distribution patterns.

For a given switch, all connections for which only very little traffic is expected could be mapped to a shared bypass. For instance, HPC applications often exhibit very particular communication patterns, in which, for example, most communications take place among immediate neighbors. In that respect, the method according to the invention may, in embodiments, comprise an initial step of determining connectivity needs of the network, e.g., relying on expected intensity of data packet arrivals at the switch ports. This in turns allows for optimizing the switch configurations (i.e., an optimized crosspoint structure for one or more switches to be used in the network and possibly how such switches can be arranged within the network too), in accordance with the determined connectivity needs.

As will be appreciated by one skilled in the art, aspects of the present invention may be embodied as a network, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may advantageously execute entirely on one or more of the end nodes or the lowest-level switches $S_{1,j}$ (e.g., in particular for Ethernet networks). It may else execute partly on a end node or a lowest-level switch and partly on a remote node or switch (e.g. a higher level switch), or entirely on one or more higher level switches if the architecture permits. Different types of networks can be contemplated. As known, such switches can merely be regarded as computers, apart from network functionalities. In this respect, each switch can be implemented in hardware. It can however be implemented as a program run by one or more processors of a general purpose computer. A general purpose computer and processors are known per se.

It will be understood that any operation for aspects of the present invention can be implemented by computer program instructions, e.g., program instructions to route data via crosspoints of a switching device of an interconnection network. Such instructions may for instance be provided to a processor of a general purpose computer, node or switch, special purpose switch, or other programmable data processing apparatus to produce a machine, such that the instructions, which execute via the processor of the switch or other programmable data processing apparatus, create means for implementing the functions/acts specified above.

These computer program instructions may also be stored in a computer readable medium that can direct a switch, computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims. For example, if most communications take place among immediate neighbors, then the direct crosspoints may be configured for enabling direct connectivity between ports corresponding to first neighbors only. Besides, although the present application essentially assumes bidirectional ports (and therefore squared switches) for illustration, applications can yet be contemplated to non-square switches with unbalanced input vs. output ports. For instance, at least some of the switches may include N input ports and M output ports, with N≠M. Such a device could be adapted for routing data packets by means of direct crosspoints, configured for enabling direct connectivity between each of the N input ports and a subset m<M of the output ports only, in accordance with connectivity needs of the computer interconnection network. Similarly, the device may comprise a number of direct crosspoints less than or equal to N M−$N_1$,$N_1$≤Min[N, M], instead of $N^2$−$N_1$, $N_1$≤N, as described earlier in an embodiment, etc.

The invention claimed is:

1. A switching device ($S_{i,j}$) adapted to connect parts of a computer interconnection network, having N input ports ($I_a$-$I_h$) and M output ports ($O_a$-$O_h$), the switching device adapted for routing data packets by means of direct crosspoints ($CP_{x,y}$), the direct crosspoints configured for enabling direct connectivity between each of the N input ports and a subset m<M of the output ports only, in accordance with connectivity needs of the computer interconnection network, with $N_1$ input ports, $N_1<N$, adapted to receive data from one or more first network entities; and $N_2$ output ports, $N_2<M$, adapted to send data to one or more second network entities, wherein a number of direct crosspoints is less than $N\,M-N_1\,N_2$, and wherein $M=N$ and a number of direct crosspoints is equal to $N^2-N_1\,N_2-(N-\mathrm{Min}(N_1,N_2))$.

2. The switching device according to claim 1, comprising a number of direct crosspoints less than or equal to $N\,M-N_1$, $N_1 \leq \mathrm{Min}[N, M]$, whereby the switching device prevents direct connectivity between at least a subset of $N_1$ input ports and $N_1$ output ports corresponding to same ports.

3. The switching device according to claim 1, wherein $N_1=N_2=N/2$.

4. The switching device according to claim 1, further comprising an additional circuitry (L) and additional crosspoints ($AP_{x,L}$, $AP_{L,y}$) configured such that at least some of the input ports of the switching device can be indirectly connected to at least some of the output ports of the switching device, through the additional circuitry.

5. The switching device according to claim 4, wherein the additional crosspoints comprise:
at least one first set of crosspoints ($AP_{x,L}$), each connecting an input port ($I_x$) of the switching device already connected to one or more direct crosspoints ($CP_{x,y}$) to the additional circuitry (L); and
at least one second set of crosspoints ($AP_{L,y}$), each connecting the additional circuitry to an output port ($O_y$) of the switching device already connected to one or more direct crosspoints ($C_{x,y}$).

6. The switching device according to claim 1, further comprising one or more first network entities ($S_{i-1,j}$) and one or more second network entities ($S_{i+1,j}$).

7. The switching device according to claim 6, wherein:
the one or more first network entities ($S_{i-1,j}$) are each a lower switching device in the computer interconnection network;
the one or more second network entities ($S_{i+1,j}$) are each an upper switching device in the computer interconnection network; and wherein
$M=N$ and $N_1=N_2=N/2$, such that the at least one switching device comprises $3N^2/4-N/2$ direct crosspoints, such as to prevent direct connectivity between:
an input port and an output port corresponding to a same port of the switching device; and
$N/2$ input ports adapted to receive data from an upper switching device and $N/2$ output ports adapted to send data to the upper switching device.

8. The switching device according to claim 7, further comprising a computerized routing method for the computer interconnection network, and wherein the computer interconnection network is further configured such that the direct crosspoints ($CP_{x,y}$) of the at least one switching device ($S_{i,j}$) can directly connect the input ports ($I_x$) to a subset of the output ports ($O_y$) only, in accordance with connectivity needs determined by the computerized routing method.

9. The switching device according to claim 8, wherein the computerized routing method for the computer interconnection network is based on an up*/down* routing algorithm.

10. A computer-implemented method for routing data with a switching device ($S_{i,j}$) adapted to connect parts of a computer interconnection network comprising one or more first network entities ($S_{i-1,j}$) and one or more second network entities ($S_{i+1,j}$), the switching device having N input ports ($I_a$-$I_h$) and M output ports ($O_a$-$O_h$), the switching device adapted for routing data packets by means of direct crosspoints ($C_{x,y}$), the direct crosspoints configured for enabling direct connectivity between each of the N input ports and a subset $m<M$ of the output ports only, in accordance with connectivity needs of the computer interconnection network, the computer-implemented method, comprising:
routing data via crosspoints ($C_{x,y}$) of the at least one switching device of the computer interconnection network, with
$N_1$ input ports, $N_1<N$, adapted to receive data from one or more first network entities; and
$N_2$ output ports, $N_2<M$, adapted to send data to one or more second network entities, wherein a number of direct crosspoints is less than $N\,M-N_1\,N_2$, and wherein $M=N$ and a number of direct crosspoints is equal to $N^2-N_1\,N_2-(N-\mathrm{Min}(N_1,N_2))$.

11. The computer-implemented method of claim 10, further comprising, prior to the step of routing data,
determining the connectivity needs by means of known or expected intensity of data packet arrivals at the input and output ports.

12. The computer-implemented method of claim 10, wherein the step of routing data comprises:
upon receiving a data packet for a pair of input port ($I_8$) and output port ($O_8$) not connected by a direct crosspoint, routing the data packet via some of additional crosspoints ($AP_{8,L}$, $AP_{L,8}$),
wherein the switching device includes additional circuitry (L), and
wherein the additional crosspoints comprise:
at least one first set of crosspoints ($AP_{x,L}$), each connecting an input port ($I_x$) of the switching device already connected to one or more direct crosspoints ($CP_{x,y}$) to the additional circuitry (L), and
at least one second set of crosspoints ($AP_{L,y}$), each connecting the additional circuitry to an output port ($O_y$) of the switching device already connected to one or more direct crosspoints ($CP_{x,y}$).

13. The computer-implemented method of claim 12, wherein the step of routing data further comprises:
upon receiving a data packet for a pair of input port ($I_8$) and output port ($O_8$) not connected by a direct crosspoint, routing the data packet by:
directing the packet to a crosspoint ($AP_{8,L}$) of the at least one first set of crosspoints ($AP_{x,L}$) connected to the input port ($I_8$) from which the data packet is received,
wherein the step of directing is via the additional circuitry (L) looping the packet back to a crosspoint ($AP_{L,8}$) of the second set of crosspoints ($AP_{L,y}$) connected to an output port ($O_8$) to which the data packet is destined.

14. A computer program product for routing data, the computer program product comprising: a non-transitory computer readable medium; and
program instructions to route data via crosspoints ($C_{x,y}$) of at least one switching device of a computer interconnection network comprising one or more first network entities ($S_{i-1,j}$) and one or more second network entities ($S_{i+1,j}$), the switching device having N input ports ($I_a$-$I_h$) and M output ports ($O_a$-$O_h$), the switching device adapted for routing data packets by means of direct crosspoints ($C_{x,y}$), the direct crosspoints configured for enabling direct connectivity between each of the N input ports and a subset $m<M$ of the output ports only, in accordance with connectivity needs of the computer interconnection network, with
$N_1$ input ports, $N_1<N$, adapted to receive data from one or more first network entities; and
$N_2$ output ports, $N_2<M$, adapted to send data to one or more second network entities, wherein a number of direct crosspoints is less than $NM-N_1 N_2$, and wherein $M=N$ and a number of direct crosspoints is equal to $N^2-N_1 N_2-(N-Min(N_1,N_2))$
wherein the program instructions are stored on the non-transitory computer readable medium.

* * * * *